US008723100B2

(12) United States Patent
Sanfilippo et al.

(10) Patent No.: US 8,723,100 B2
(45) Date of Patent: May 13, 2014

(54) METHOD OF DETECTING IMPINGING POSITION OF PHOTONS ON A GEIGER-MODE AVALANCHE PHOTODIODE, RELATED GEIGER-MODE AVALANCHE PHOTODIODE AND FABRICATION PROCESS

(75) Inventors: Delfo Nunziato Sanfilippo, Catania (IT); Giovanni Condorelli, Misterbianco (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 493 days.

(21) Appl. No.: 13/053,595

(22) Filed: Mar. 22, 2011

(65) Prior Publication Data
US 2011/0272561 A1 Nov. 10, 2011

(30) Foreign Application Priority Data
Mar. 23, 2010 (IT) .............................. VA2010A0026

(51) Int. Cl.
*H01L 31/107* (2006.01)
*H01L 31/18* (2006.01)
*H01L 27/146* (2006.01)

(52) U.S. Cl.
USPC ..................... 250/214.1; 250/208.1; 257/438; 257/443; 257/E27.133; 257/E31.063; 438/91

(58) Field of Classification Search
USPC .................. 250/214.1, 214 R, 208.1, 370.01, 250/370.08, 370.09, 370.14; 257/438, 431, 257/443, E27.133, E31.001, E31.133; 438/91
See application file for complete search history.

(56) References Cited

U.S. PATENT DOCUMENTS

| 7,262,402 | B2 | 8/2007 | Niclass et al. .............. 250/214.1 |
| 7,403,589 | B1 | 7/2008 | Short et al. |
| 2008/0203309 | A1 | 8/2008 | Frach et al. .................... 250/362 |
| 2008/0317200 | A1 | 12/2008 | Lecomte et al. |
| 2009/0184317 | A1* | 7/2009 | Sanfilippo et al. .............. 257/49 |
| 2009/0184384 | A1* | 7/2009 | Sanfilippo et al. ............. 257/432 |
| 2010/0102242 | A1 | 4/2010 | Burr et al. |
| 2010/0148040 | A1* | 6/2010 | Sanfilippo et al. ......... 250/214.1 |
| 2010/0271108 | A1* | 10/2010 | Sanfilippo et al. ............ 327/502 |
| 2010/0296540 | A1* | 11/2010 | Pan ......................... 372/45.012 |
| 2011/0095388 | A1* | 4/2011 | Richter et al. ................ 257/432 |
| 2011/0241149 | A1* | 10/2011 | Mazzillo et al. .............. 257/438 |

(Continued)

FOREIGN PATENT DOCUMENTS

| EP | 1 132 724 | 9/2001 |
| WO | WO 00/38248 | 6/2000 |

OTHER PUBLICATIONS

Bonnano et al., "CMOS-APS for Astrophysical Applications," Memorie S.A.It. 2003, vol. 74, pp. 800-803.

(Continued)

*Primary Examiner* — John Lee
(74) *Attorney, Agent, or Firm* — Allen, Dyer, Doppelt, Milbrath & Gilchrist, P.A.

(57) ABSTRACT

A Geiger-mode avalanche photodiode may include an anode, a cathode, an output pad electrically insulated from the anode and the cathode, a semiconductor layer having resistive anode and cathode regions, and a metal structure in the semiconductor layer and capacitively coupled to a region from the resistive anode and resistive cathode regions and connected to the output pad. The output pad is for detecting spikes correlated to avalanche events.

19 Claims, 6 Drawing Sheets

(56) References Cited

U.S. PATENT DOCUMENTS

| | | | |
|---|---|---|---|
| 2011/0272561 A1* | 11/2011 | Sanfilippo et al. | 250/214.1 |
| 2012/0199932 A1* | 8/2012 | Bowers | 257/438 |
| 2012/0267746 A1* | 10/2012 | Sanfilippo et al. | 257/438 |

OTHER PUBLICATIONS

Sciacca et al., "Silicon Planar Technology for Single-Photon Optical Detectors," IEEE Transactions on Electron Devices, vol. 50, No. 4, Apr. 2003, pp. 1-8.

Kripesh et al., "Three-Dimensional System-in-Package Using Stacked Silicon Platform Technology," IEEE Transactions on Advanced Packaging, vol. 28, No. 3, Aug. 2005, pp. 377-386.

Mazzillo et al., "Single Photon Avalanche Photodiodes Arrays," Sensors and Actuators A 138 (2007), pp. 306-312.

Cova et al., "Avalanche Photodiodes and Quenching Circuits for Single-Photon Detection," Applied Optics, vol. 35, No. 12, Apr. 20, 1996, pp. 1957-1976.

Search Report for Italian Application No. ITVA20100026 dated Nov. 4, 2010, with translation of Written Opinion.

\* cited by examiner

METHOD OF DETECTING IMPINGING POSITION OF PHOTONS ON A GEIGER-MODE AVALANCHE PHOTODIODE, RELATED GEIGER-MODE AVALANCHE PHOTODIODE AND FABRICATION PROCESS

FIELD OF THE INVENTION

The preset invention is generally directed to the field of photon detection, and in particular, the detection of individual photons. In particular, the present invention refers to position sensitive monolithic arrays of Geiger-Mode Avalanche Photodiodes (GMAPs) and to related integrated readout systems.

BACKGROUND OF THE INVENTION

Detector arrays are used in a wide variety of imaging systems for industrial as well as scientific applications. For example, detector arrays have been recently widely used in nuclear medical imaging techniques such as Positron Emission Tomography (PET). In this application, 511 keV gamma rays, emitted by the human body, strike pixelated scintillators which create light in response to the received radiation. Each illuminated pixel of the pixelated scintillator is detected in the detector array by a respective photodiode, which converts the light into electrical signals used for imaging purposes. During data collection, each pixel provides an electrical output signal proportional to the absorbed photon flux. These output signals are then processed to create an image of the internal features of the subject [1].

Charged Coupled Device (CCD) technology is commonly used for imaging applications due to its high quantum efficiency in the visible band and low readout noise even at relatively high scan rates. In recent years, CMOS-Active Pixel Sensors (APS) have been developed and used for high speed imaging applications, as, for example, in adaptive optics, star trackers, and fast video-rate readout systems. CCD devices exhibit better performance in terms of high fill factor and consequently high quantum efficiency and low noise. However, CMOS APS devices are more and more used due to their better timing performance, low fabrication cost and easy foundry access [2].

A great effort has been recently spent for the realization of GMAP (Geiger-Mode Avalanche Photodiodes) imaging arrays, which by exploiting the faster timing response (<100 ps) of the photodiodes, can allow a three-dimensional imaging of the objects by using time of flight techniques. The packaging of these devices and the integration of the detector with the electronics is a quite complex matter and various techniques have been developed in recent years to realize compact and cheap "packaging" approaches.

In any case, it may be necessary to provide large area and high fill factor arrays whose pixels have to be individually addressable by using suitable independent driving and readout circuits for each pixel of the array. The larger the number of pixels in the array, the higher the dynamic range and consequently the more accurate the spatial information provided by the whole photodetector. Moreover, the greater the whole dimension and the geometrical fill factor of the array, the greater its sensitivity.

In typical semiconductor fabrication systems, chips are built up in large numbers on a single large "wafer" of semiconductor material, typically silicon. The individual chips are patterned with small pads of metal (usually near their edges) that serve as the connections to an eventual mechanical carrier. The chips are then cut out of the wafer and attached to their carriers, typically with small wires (wire bonding). These wires eventually lead to pins on the outside of the carriers, which are attached to the rest of the circuitry making up the electronic system. It may be necessary to connect each pixel in the array to appropriate external circuitry such that for arrays with a high number of pixels it may be practically impossible to use the wire bonding for the packaging.

A possible approach to overcome this problem could be to use a Chip Scale Package (CSP), which is a single-die, direct surface mountable package with an area of no more than 1.2 times the original die area. The advantages offered by chip scale packages include smaller size (reduced footprint and thickness), lesser weight, an relatively easier assembly process, lower over-all production costs, and an improvement in electrical performance. CSPs are also tolerant of die size changes, since a reduced die size can still be accommodated by the interposer design without changing the CSPs footprint.

Chip scale packaging can combine the advantages of various packaging technologies, such as the size and performance advantage of bare die assembly and the reliability of encapsulated devices. The significant size and weight reduction offered by the CSP makes it ideal for use in mobile devices like cell phones, laptops, palmtops, and digital cameras.

Another possible approach is to use Through Silicon Vias (TSV) technology for the integration of the detector with the electronics. TSV is a vertical electrical connection (via) passing completely through a silicon wafer or die. In this case, the detector die and the electronics chips are vertically stacked and the contacts from the topside of the detector are carried out through the vias to the backside of the die and then suitably soldered to the driving and readout circuitry.

The through-via technology made remarkable advances in the latter half of the 90s, when important process technologies, such as deep silicon etching, wafer thinning and wafer/chip bonding, were developed. However the high complexity of technology and large amount of cost used for their development made them difficult to apply to low-end products [3].

The digital pixel output readout for GMAPs array devices is available in a few prototype circuits based on CMOS APS technology. Several patents in this direction have been made by the group of E. Charbon at Ecole Polytechnique Federal de Lausanne [4] and lately by the group of T. Frach at Philips Intellectual Property and Standards [5]. See U.S. Pat. No. 7,262,402 to Cristiano et al. and U.S. Patent Application Publication No. 2008/0203309 to Frach et al. In of both these approaches, the different parts of the integrated readout system, also manufactured in CMOS technology, are placed next to each photodiode and at the edge of the array.

Innovative structures of Geiger-mode avalanche photodiodes are disclosed in the U.S. Patent Application Publication Nos. 2009/0184317 and 2009/0184384 to Sanfilippo et al. These photodiodes are equipped with an integrated quenching resistor and further have a metal shield defined in an oxide-coated trench to reduce cross-talk effects between different co-integrated photodiodes. Unfortunately, Geiger-mode avalanche photodiodes may need relatively complex read circuitry.

The used CMOS technology introduces some limits to device applications: approach complexity; and at least two circuits may be needed, one to bias the device and one to read an output signal. This may increase device fabrication costs, in particular due to the readout system manufacture, and may reduce in a significant way the ratio between the sensitivity area and the overall area (geometrical fill factor), affecting as a consequence array sensitivity. CMOS technology is not optimized for high sensitivity detectors and has noise problems such as dark counts, afterpulsing and so on [6].

SUMMARY OF THE INVENTION

Geiger-mode avalanche photodiodes and methods are for detecting photons impinging position on a Geiger-mode avalanche photodiode that allow simplification of the circuitry for sensing when an avalanche current is flowing throughout the photodiode are disclosed herein.

Typically, every integrated Geiger-mode avalanche photodiode may have resistive anode and cathode regions through which avalanche currents triggered by received photons flow. According to the present invention, at least one metal structure capacitively coupled to either the resistive anode or cathode region is realized. When a current flows through these regions, spikes correlated to avalanche events of the photodiode may be sensed on a terminal of the metal structure.

According to another aspect, a plurality of Geiger-mode avalanche photodiodes are integrated on a same semiconductor layer to form an array, the metal structures of photodiodes of the same column (or, equivalently, of the same row) may be electrically connected to a respective column (or row) pad, and are electrically isolated from similar metal structures of the photodiodes of a different column.

Differently from the typical arrays of photodiodes that may have only cathode and anode pads, the disclosed array has at least a third pad, connected to related row or column metal structures, on which an output signal is available each time a photon impinges on a reverse biased photodiode capacitively coupled thereto.

According to an embodiment, the metal structure of each photodiode may surround either the resistive anode or the resistive cathode regions of the photodiode and effectively acts also as a metal shield that reduces cross-talk. Another aspect is directed to a fabrication process of the disclosed avalanche photodiode and two different methods of sensing spikes of each photodiode of the array are also disclosed.

FIGS. from 7 to 11 show phases of a production process of an array of avalanche photodiodes, according to the present invention.

DETAILED DESCRIPTION OF THE PREFERRED EMBODIMENTS

Figure 1:
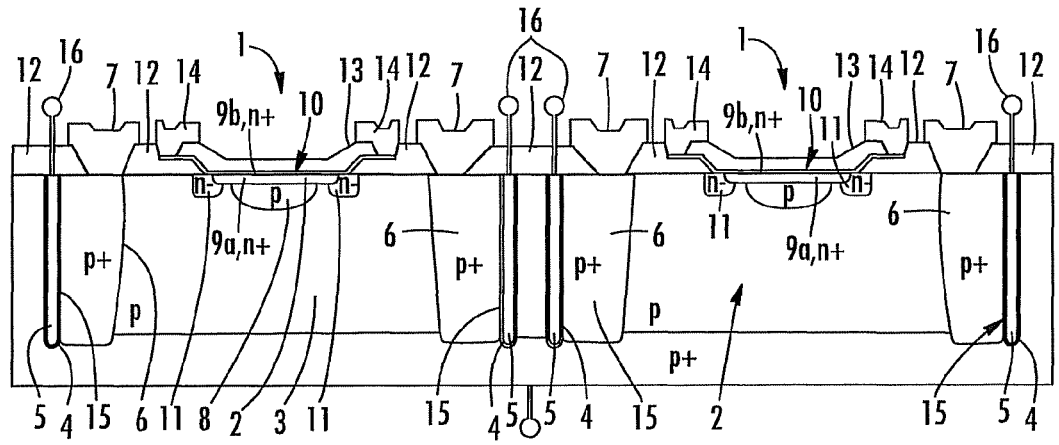
FIG. 1 shows the structure of two nearby avalanche photodiodes, according to the present invention.

A exemplary structure of an array of Geiger-mode avalanche photodiodes is schematically illustrated in FIG. 1. In the depicted example, only two photodiodes are shown, though the array may comprise any number of photodiodes organized in rows and columns. The avalanche photodiode has three terminals instead of two: a cathode contact 14, an anode contact 7, a metal structure 5 having a terminal 16 on which spikes correlated to avalanche events of the photodiode may be sensed. The metal structure 5 is defined in a trench coated with a dielectric 4, preferably silicon oxide, and is thus capacitively coupled with a region of the photodiode, that in the shown example is the anode diffusion 6.

Other details of the embodiment of FIG. 1, such as the definition of the cathode and anode regions and the definition of the metal structures, may be discussed later. The avalanche photodiode has anode or cathode diffusion that opposes a resistance (even if it may be relatively small) to avalanche current circulation, and a metal structure capacitively coupled with this resistive anode or cathode diffusion. In the shown example of FIG. 1, the metal structure 5 is capacitively coupled to the resistive anode diffusion 6.

By inverting the doping types, it is possible to switch the roles of the anode and cathode diffusions and to have a metal structure capacitively coupled with the cathode diffusion. For this reason, in the ensuing description reference may be made to the case in which the metal structure is capacitively coupled to the resistive anode diffusion, though the same considerations apply in the same manner to a metal structure that in such an equivalent (dual) integrated array structure would be capacitively coupled to the cathode diffusion.

Preferably, but not necessarily, the metal structure 5 is defined such as to surround each photodiode and to shield it laterally from photons emitted by adjacent photodiodes during the avalanche events (optical cross-talk). Moreover, the dielectric coating 4 prevents electrical cross-talk effects between photodiodes.

To simplify connections of the anodes to a reference potential (ground), each photodiode has front side anode contacts and the whole array has a common back side anode contact in correspondence of a back side anode diffusion 3, practically "shorted" to the front side anode contacts through the anode diffusion 6 that extends from the front surface down to the back-side anode diffusion 3.

The fact that signals correlated to avalanche events are made available on a terminal electrically distinct from the anode and cathode contacts, greatly simplifies the readout circuitry for the disclosed photodiode, while providing all advantages of the prior photodiodes of U.S. Patent Application Publication Nos. 2009/0184317 and 2009/0184384 to Sanfilippo et al.

Figure 2:
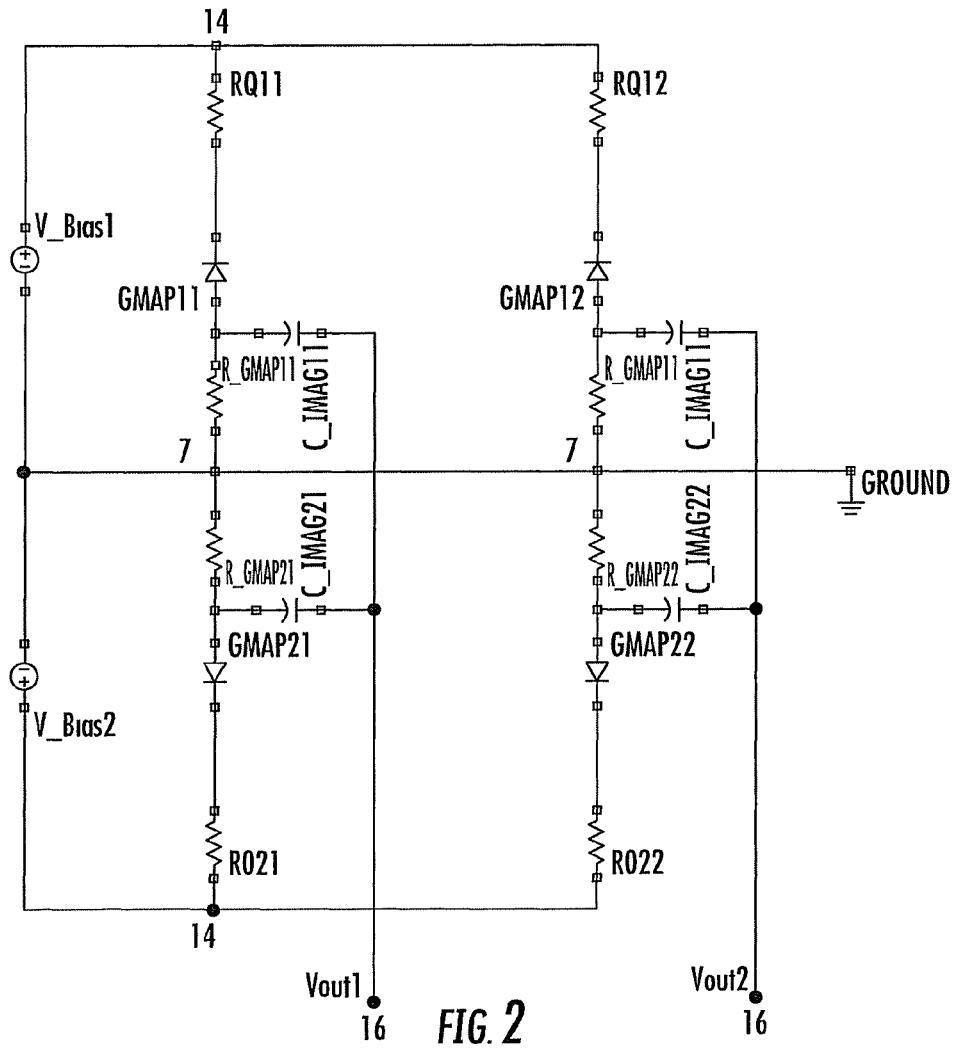
FIG. 2 shows an equivalent circuit of a 2×2 array of avalanche photodiodes with anode capacitor readout configuration, according to the present invention.

To better understand how the photodiode may generate output signals on the terminals 16, reference is made to the equivalent circuit of a 2×2 array of avalanche photodiodes, shown in FIG. 2. Each photodiode may be modeled as an ideal diode GMAP having an anode resistance R_GMAP of relatively small value, a cathode connected resistance RQ of relatively large value, that acts as a quenching resistor of the photodiode, and a capacitance C_IMAG represented by the metal structure (metal shield) 5 capacitively coupled to the resistive anode diffusion 6 by the oxide layer 4.

According to a common bias technique, the anode is referred to ground and the photodiodes are inversely (negatively) biased with an inverse (reverse) bias voltage V_bias. When a photon impinges on the exposed surface of a photodiode, an avalanche current flows therethrough and also through the anode resistive diffusion capacitively coupled to the metal structure. Therefore, a sudden raise of the avalanche current causes a current spike on the metal structure 5.

Figure 3:
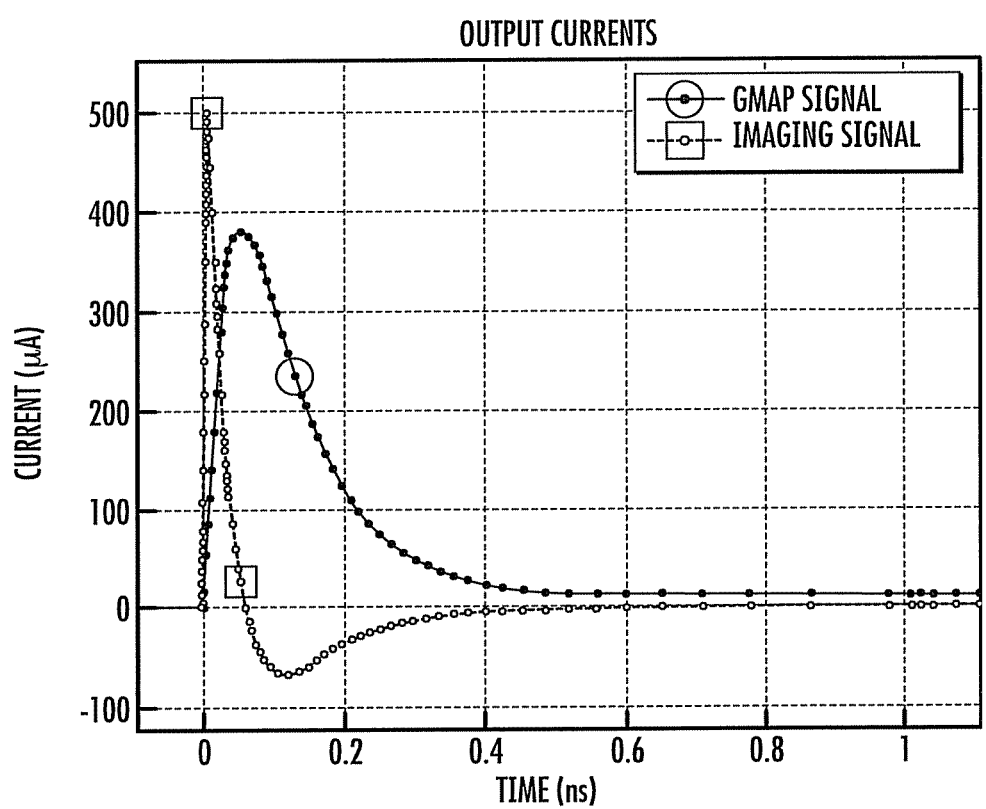
FIG. 3 depicts exemplary waveforms of the photodiode current and of the current read on columns output nodes of the of avalanche photodiodes with anode capacitor readout configuration, according to the present invention.

An exemplary waveform of the avalanche current flowing through the diode GMAP is shown in the graph of FIG. 3. When a photon impinges on the active area of a reverse biased photodiode, an avalanche current is triggered and circulates through the anode and cathode of the photodiode, reaches a peak, then drops exponentially because of the quenching resistor RQ. The capacitance C_IMAG is crossed by a current proportional to the time derivative of the voltage drop on the resistance R_GMAP. Therefore, with the avalanche photodiode structure, it is possible to detect almost instantaneously an impinging photon.

It is not necessary to have relatively large peaks of the avalanche current through the diode GMAP for properly detecting when a photon has been received. Therefore, it is also possible to shorten the time interval in which the avalanche current occurs, thus making the photodiode more quickly ready for receiving another photon. Indeed, a current pulse may be sensed on the terminal 16 when a photon is absorbed. This pulse is sufficiently large to be easily read without needing further amplification stages.

The values of the capacitances C_IMAG may be determined as a trade-off between the maximization of the output signal peak and the minimization of electrical cross-talk effects between different photodiodes of the array. The values of other elements are typical of GMAP technology, where the substrate is used to implement the $R_{GMAP}$ resistors, which values are of few hundreds of Ohm. The output signals could be read through a very simple circuit made by a small value resistor (tens of Ohm).

According to another aspect, the metal structures (shields) 5 of photodiodes belonging to a same column (or equivalently to a same row) are electrically connected in common and are electrically separated from the metal structures 5 of photodiodes belonging to a different column (row). As may be better explained later, this further simplifies scanning operations of the photodiodes of the array.

The structure of one exemplary embodiment of the photodiode is described in detail in the ensuing disclosure while referring to FIG. 1.

Device Structure Description

An embodiment of a vertical structure of two nearby GMAPs 1 is shown in FIG. 1. The GMAP active area is defined by the p enrichment diffusion 8 (anode); this enrichment diffusion 8 identifies also the high electric field active region. The anode is contacted by a metal bus connected to $p^+$ anode contact layer 6 or by a back-side metallization of the $p^+$ substrate 3.

A deposition of n+ thin polysilicon layer $9_b$,n+ doped with arsenic and a diffusion $9_a$,n+ realize the cathode layer. A metal bus 14 is used to contact that layer (cathode). To fabricate large arrays, those skilled in the art will appreciate approaches to edge breakdown problems, low defectivity production processes for noise reduction, large resistor integration around each pixel area for photomultiplier miming mode and electrical and optical isolation issues between different pixels.

To avoid edge breakdown problem, it may be necessary to realize an effective edge structure for the p-n junction of each pixel 1. One approach is creating a localized zone 8 of enhanced doping anode below the cathode. The other possibility is to create a depletion ring 11 around the cathode. In the shown preferred embodiment, both the zone 8 and the depletion ring 11 are present.

One of the most important issues in GMAP fabrication may be the noise reduction. The main noise source is correlated to the defects of the pixel active region, in particular with cathode formation. The standard way to realize the cathode layer is an implantation on the top of silicon; however, the drawback is the formation of end-of-range defects in the pixel active region. If a polysilicon layer is first deposited and then implanted, the end-of-range defects should not reach the active area region. This is not true for the exponential tail of the defects profile. Because the device is sensitive also to a single defect, it has been found that this approach provided undesirable results.

In this embodiment, a deposition of doped polysilicon and a diffusion $9_a$,n+ to realize a cathode layer is used. With this technique, direct implantation of silicon is avoided, thus reducing defects. There is the possibility of combining the deposition of doped polysilicon and ionic implantation to obtain a polysilicon with a different doping concentration, thus realizing an integrated quenching resistor 10, directly connected to the cathode metallization.

Another possibility to realize integrated quenching resistors is the use of a dedicated conductive layer with properly determined resistivity, for example, a second deposition of doped polysilicon. To reduce the crosstalk effect between nearby GMAPs, a biased trench 15 cut into silicon, first oxidized 4 and then filled with metal 5, is realized. This trench 15 fully surrounds each GMAP 1 and is connected to the trenches 15 of the nearby GMAPs on the same column. The trench 15 acts, with the metal filling 5, against the photons flow and, with the oxide coat 4, against the electron flow. To further reduce the crosstalk electron flow, it is possible to surround each diode 1 with a $p^+$ substrate 3 and a $p^+$ anode contact layer 6, where the electron life-time is very short. The integrated capacitors C_IMAG (FIG. 2), used to digitally read the output GMAPs signals, are implemented by using the previously mentioned biased trenches.

Layout Description

Figure 4:
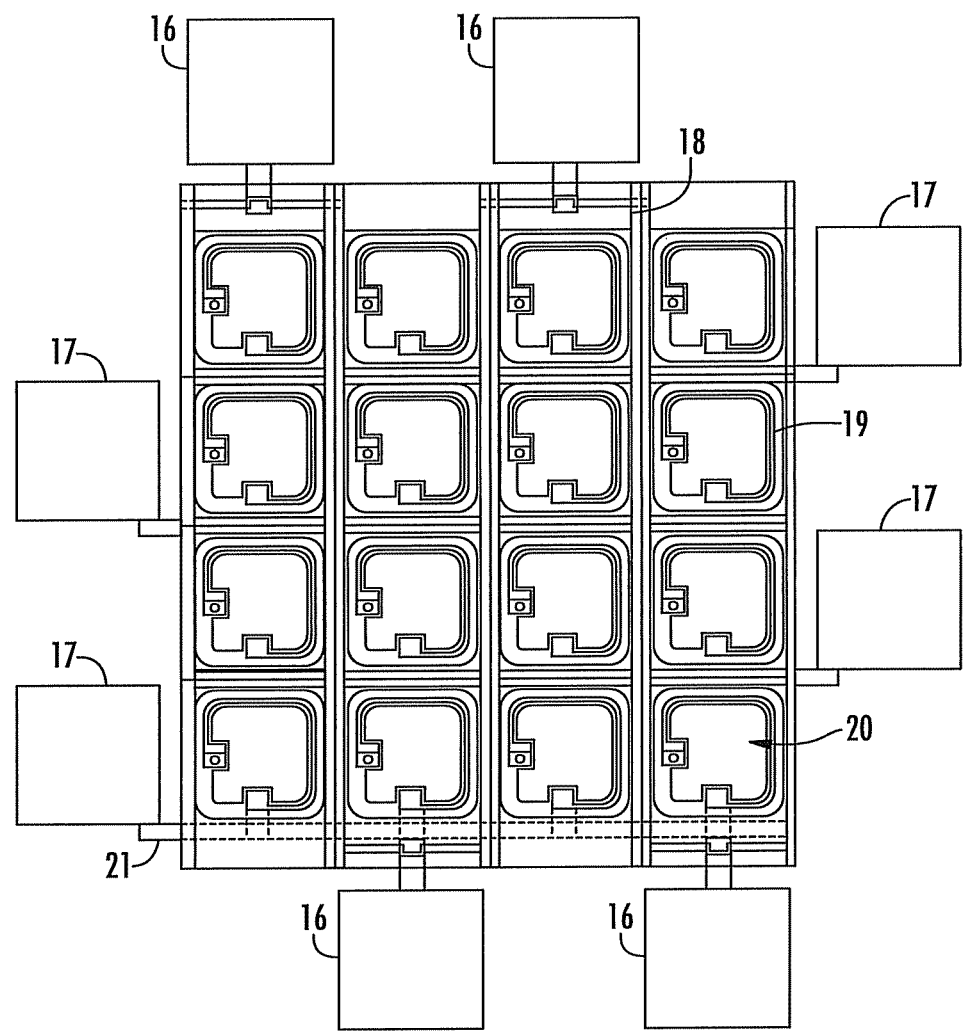
FIG. 4 is a plant view of a layout of a 4×4 array of avalanche photodiodes, according to the present invention.

FIG. 4 is a layout of a 4×4 array of Geiger-mode avalanche photodiodes. The GMAPs cathodes are connected to pads 17 through a conductive strip 21, in common with the other pixels belonging to the same row (one pad 17 for each row). The read out signal is taken on pads 16. These pads are connected to the trenches 18 belonging to the GMAPs lying in the same column (one pad 16 for each column). The trench 18 fully surrounds each GMAP and is connected to the trenches of the nearby GMAPs on the same column. It is to be noticed that the trench columns are disconnected from each other.

The cathodes are contacted per rows by front-side metal buses 21, and the anode contacts are on the back-side of the wafer. Optionally, TSV (Through-Silicon Vias) could be used for both cathode and anode contacts to provide back-side connections. Cathodes of photodiodes of the array belonging to a same row are connected to a same row pad, and metal shields of photodiodes of a same column are electrically connected to a respective column pad and separated by metal shields of photodiodes of a different column.

Figure 5:
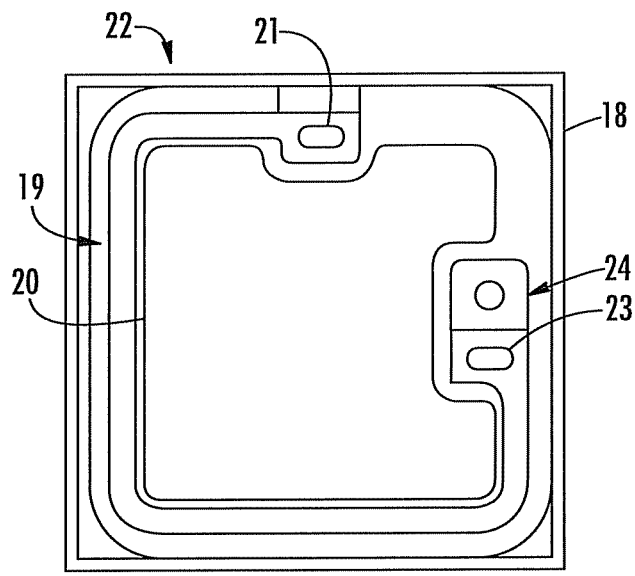
FIG. 5 is a plant view of a layout of a single avalanche photodiode, according to the present invention.
Figure 6:
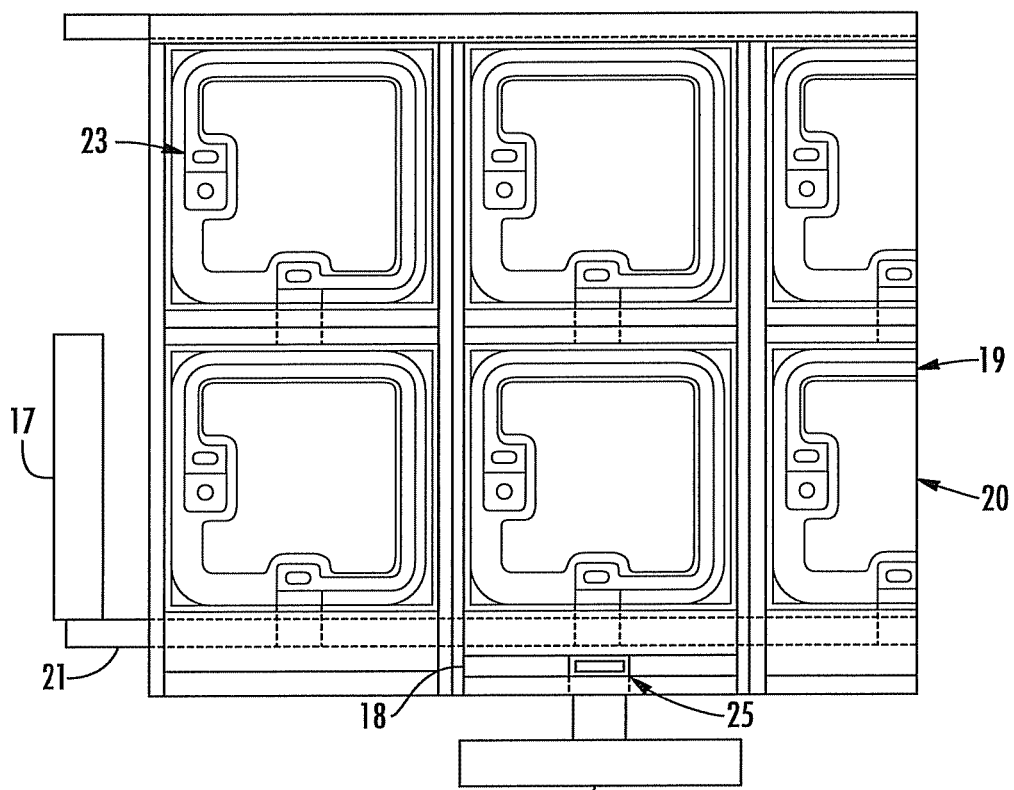
FIG. 6 is a detailed view of the array of FIG. 4.

FIGS. 5 and 6 are enlarged views of the exemplary layout of FIG. 4. Each pixel 22 is connected to the corresponding conductive strip 21 by the resistor 19. The resistor 19 is connected to the pixel cathode by the contacts 23 and 24 linked with a metal bus. The resistor 19 also serves to quench the avalanche in the GMAP 22 once the cell capacity discharges. The trench contact 25 is used to connect each trench column 18 to the pad 16, by a metal strip.

The depicted layout allows two distinct read modes of the Geiger-Mode Avalanche Photodiodes of the array: reading one pixel at the time per rows by biasing one row and reading current spikes on one column pad at the time; and reading one pixel by biasing all rows simultaneously and reading the current signals available on the corresponding row pad and column pad of the pixel.

The first reading technique, described above, basically comprises the read action for one pixel at a time with a pre-arranged timing through the enabling of one bias row and one readout column. Referring to the equivalent circuit of FIG. 2, when row 1 is enabled, it is possible to read GMAP 11 pixel in column 1 and straight after the pixel GMAP_12 switching from column 1 to column 2 in readout enabling.

In the second reading technique, both the column signals and the row signals coming from the same pixel are read at the same time by enabling the bias in all the rows simultaneously. For example, if the pixel GMAP_11 detects a photon, two contemporaneous signals are available on row 1 and column 1.

As usual in the Geiger Mode Avalanche Photodiodes (GMAP), they have a very low dark current. Each GMAP is biased above breakdown and remains quiescent until, in dark conditions, the first carrier of the dark current triggers an avalanche due to impact ionization mechanisms. In this time interval, which is long according to the defects of the pixel active region, one electron-hole pair generated by photon absorption can start an avalanche marking the photon detection. Because the multiplication process above breakdown presents a self-sustaining mechanism, a quenching circuit, active or passive, has to be used to reset the pixel and to make it ready to detect another photon [7]. The passive quenching comprises a large resistance value resistor in series with the GMAP. When the GMAP is fired by a photon, the avalanche current flows on the resistor and so the bias on the pixel is lowered to a point that the multiplication chain is not self-sustained anymore and the avalanche is quenched. The bias on the pixel then starts to increase again with an exponential rise, resetting the GMAP for another photon arrival [7]. This approach may provide all avalanche events with equality and without amplification needs because of the high gain.

Fabrication Process

In this section, an exemplary flow chart designed to fabricate arrays of GMAPs with trenches is described. This flow chart has been designed also to find approaches to the other issues previously mentioned. In particular, the following features should be noted:
the polysilicon (or equivalent material) layer deposition, in situ doped, which forms the cathode;
the second deposition of doped polysilicon (or equivalent material) to realize the integrated quenching resistors;
the trench processing including the metal filling;
the trench contact process to connect each trenches column to the respective pad;
the realization of an anti-reflective coating by specific layers deposition over the device active area;
the possibility to avoid carefully edge breakdown by combining guard ring effect with central enrichment layer;
the active p-n junction engineering by using deposition of polysilicon in situ doped; and
the process to realize the integrated quenching resistor around each pixel by using polysilicon with a different doping concentration.

The process for fabricating the structure depicted in FIG. 1 starts with the epitaxial growth of a $p^-$ boron doped layer. The $p^+$ regions are then created with a high-dose boron implantation step, to reduce the contact resistance of the anode and provide a low resistance path to the avalanche current. The included steps are: thermal oxidation to grow an oxide layer; lithography; and an oxide etch.

Figure 7:
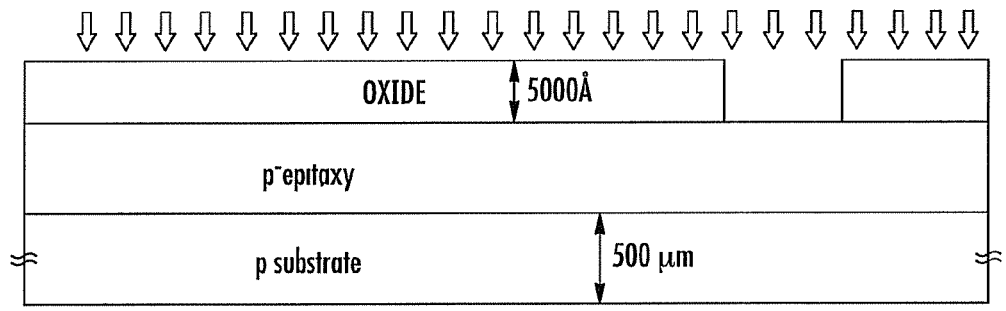

Bearing in mind that a heavy dose implantation may be used for the $p^+$, a pre-implanted oxide of 500-1000 Å is grown. Without this precaution, residual metal impurities from the implantation process might contaminate the wafer. (Pre-implant of 500-1000 Å; and Boron ionic implantation). The obtained structure is depicted in FIG. 7.

Now disclosed are the steps to form the active junction. During these steps, it may be important to keep the junction free of contaminants, avoiding dry etch, silicon stress, implant processes and so on. Unfortunately, as far as implementation is concerned, the p enrichment region uses a low energy boron implantation, with a peak concentration of 1 to $5 \times 10^{16}$ $cm^{-3}$, followed by a high temperature anneal.

To reduce the contamination of the implanted region before covering it with a polysilicon layer, the active area is first opened larger than the enrichment region and an implant is performed through a resist mask, instead of an oxide mask.

The following steps are performed: an oxide removal; thermal oxidation of 3000-5000 Å; an active area lithography; and an oxide wet etch. The oxide etch by a wet process avoids any possible radiation damage in the active area.

Figure 8:
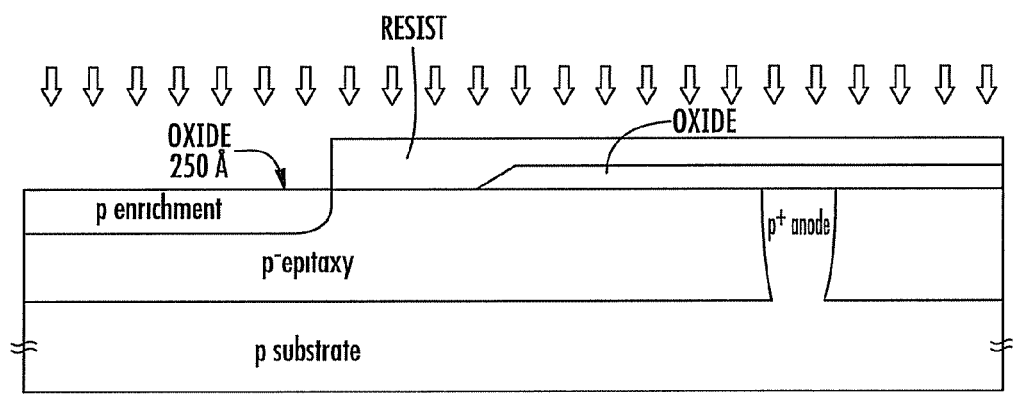

In the next process, a resist mask is adopted for the boron implant. The following steps are performed: pre implant oxidation of 200-400 Å; enrichment lithography; and enrichment implant. The resulting structure is shown in FIG. 8. In the same way, by using a resist mask, the depletion ring around the cathode is formed.

At this stage, to anneal the damage created by the implanted ions, and to electrically activate the dopants, a thermal annealing at 1150° C. for 2-4 hours is performed. This high thermal budget produces the enrichment doping profile used by the electrical simulation. A reproducible junction breakdown voltage of about 30 Volts is obtained.

The polysilicon layer, in situ doped, which forms the cathode, is deposited after the pre-implanted oxide removal by a wet etch. More in detail, the sequence is the following one: pre-implanted oxide wet etch; and N-Poly deposition.

A 500-1000 Å thick layer has been chosen as a good trade-off between a thin dead layer for the photon detection at the UV wavelengths, and the feasibility with the available equipment in the clean room. The use of polysilicon is not required, it is just the exemplary approach. (N-Poly lithography; and N-Poly Etch)

Before the drive-in of the arsenic from the polysilicon into the epitaxial layer, a CVD oxide layer is deposited. The effect of this layer is threefold. First, it prevents the out diffusion of arsenic when the wafer is subjected to thermal annealing processes. Second, it constitutes the passivation layer for the active area region. Third, it protects the active area during the subsequent fabrication steps.

Figure 9:
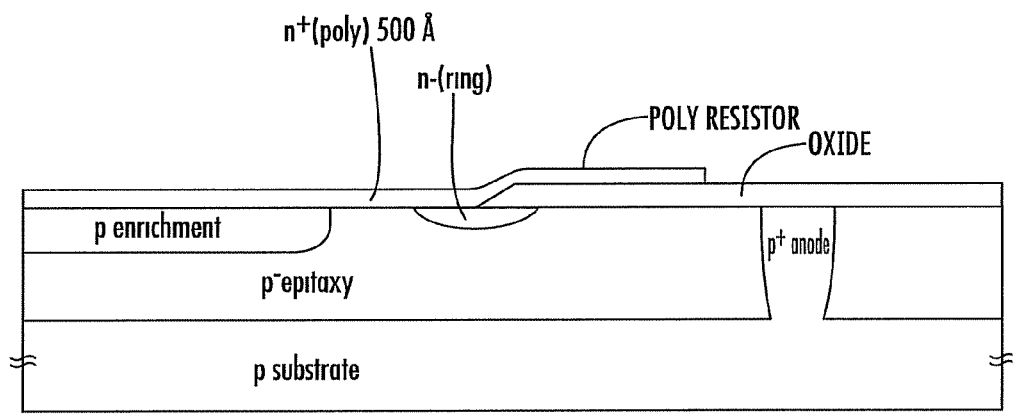

To drive in the Arsenic, different rapid thermal annealing conditions have been adopted. The dark count rate performance improves when the metallurgical junction is deeper in the semiconductor. For example, the annealing may be at 1000° C. The resulting structure is shown in FIG. 9.

At this stage there is the possibility to realize the integrated quenching resistors by using a dedicated conductive layer with a proper resistivity, for example, a second deposition of doped polysilicon (or equivalent material).

Figure 10:
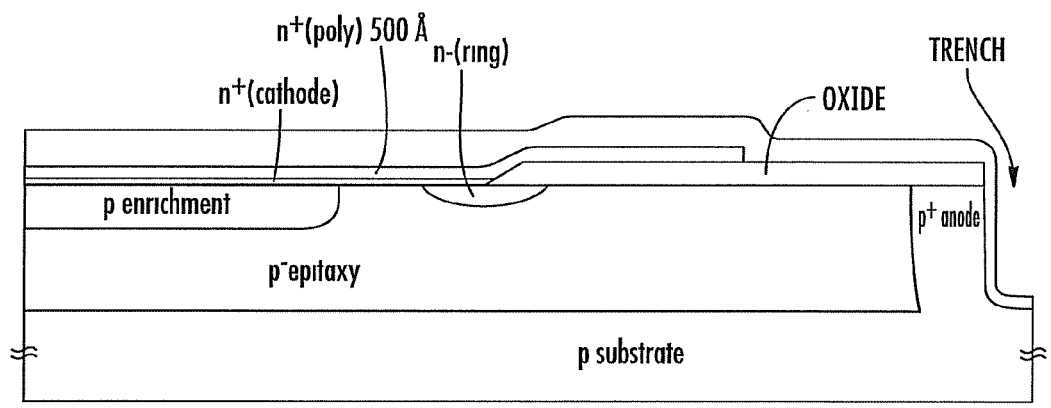

The trench processing is performed as described in the following paragraphs. By way of a lithography mask named Optical Trench, trenches around the pixels with a width of about 1 μm are defined. With a specifically designed and calibrated dry etch, trenches deep about 8-10 μm are cut into silicon. The trench sidewalls are covered with a thin thermal oxide, 100-200 Å thick, and a CVD TEOS, 500-1000 Å thick (FIG. 10).

The last action for the trench processing is the metal filling. To obtain the electrical insulation from the following metal strips, the top of optical trench is covered by depositing a thick layer of TEOS and SOG on the wafer. The active area of the device is then covered with specific layers (for example silicon nitride on oxide) to realize an anti-reflective coating. The thickness of those layers is chosen to minimize surface optical reflection at a fixed wavelength.

Figure 11:
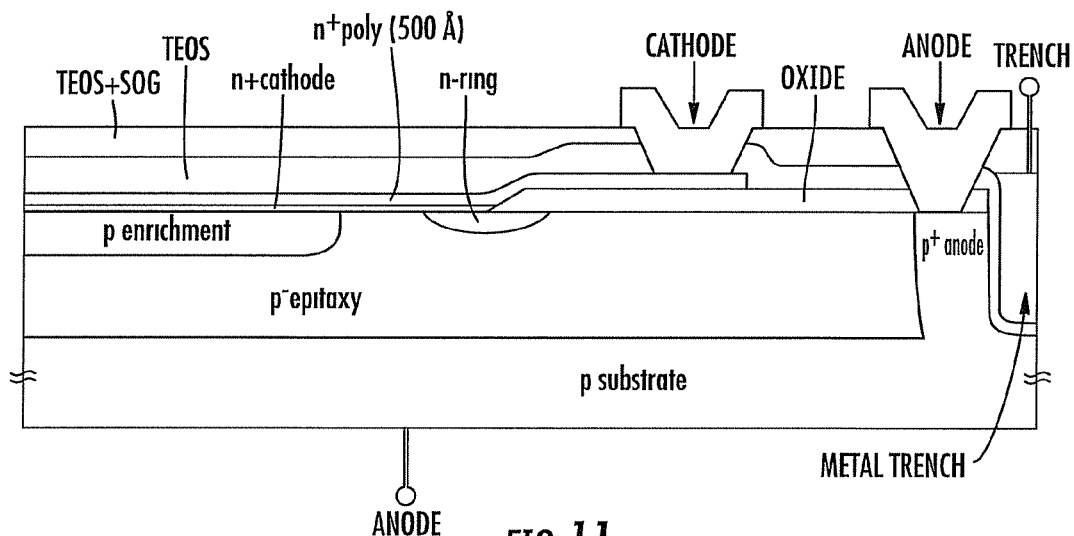

Contacts are then formed using oxide etches and the metal is deposited by sputtering. After the metal photomask development and the subsequent etch, a sintering process at low temperature in hydrogen ends the fabrication process (FIG. 11). This step passivates with hydrogen the dangling bonds at the interface between oxide and silicon. When the metallurgical junction is close to the surface, surface electronic state, which can increase the SHR generation rate, should be reduced or eliminated.

Preferred dopant concentrations are as in the following table:

| | |
|---|---|
| epitaxial layer (2) | between 1e15 and 5e15 atoms/cm$^3$ |
| buried anode diffusion (3) | between 1e18 and 1e19 atoms/cm$^3$ |
| second anode diffusion (6) | between 5e17 and 5e18 atoms/cm$^3$ |
| enrichment diffusion (8) | between 1e16 and 5e16 atoms/cm$^3$ |
| depletion ring diffusion (11) | between 1e16 and 5e16 atoms/cm$^3$ |
| first cathode diffusion (9a) | 5e18 and 1e19 atoms/cm$^3$ |
| second cathode layer (9b) | 1e19 and 5e19 atoms/cm$^3$ |

REFERENCES

[1] M. Mazzillo, G. Condorelli, A. Campisi, E. Sciacca, M. Belluso, S. Billotta, D. Sanfilippo, G. Fallica, L. Cosentino, P. Finocchiaro, S. Privitera, S. Tudisco, S. Lombardo, E. Rimini, G. Bonanno, "Silicon Photon Avalanche Photodiodes Array", Sensors and Actuators A 138 (2007) 306-312.

[2] G. Bonanno, M. Belluso, R. Cosentino, S. Scuderi, "CMOS-APS for astrophysical applications", Memorie Sait 2003, Vol. 74, pp. 800-803.

[3] V. Kripesh, Seung Wook Yoon, V P Ganesh, Rajnish Kumar Sharma, S. Mohanraj, Mahadeven Iyer, "3D System in Package using Stacked Silicon Platform technology", IEEE Transactions on Advanced Packaging, Vol. 28, No. 3, August, pp. 377 (2005).

[4] C. Niclass E. Charbon, P. Besse, A. Rochas, "Integrated Imager Circuit Comprising a Monolithic Array of Single Photon Avalanche Diodes", U.S. Pat. No. 7,262,402 B2, Aug. 28, 2007.

[5] T. Frach, K. Fielder, "Digital Silicon Photomultiplier for TOE-PET", patent No. US 2008/0203309 A1, Aug. 28, 2008.

[6] E. Sciacca, A. C. Giudice, D. Sanfilippo, F. Zappa, S. Lombardo, R. Consentino, C. Di Franco, M. Ghioni, G. Fallica, G. Bonanno, S. Cova, E. Rimini, "Silicon planar technology for single-photon optical detectors", IEEE Trans. Electron Devices, vol. 50, no. 4, pp. 918, April 2003, and references therein.

[7] S. Cova, M. Ghioni, A. Lacaita, C. Samori, and F. Zappa, "Avalanche photodiodes and quenching circuits for single-photon detection", Applied Optics, Vol. 35, No. 12, pg. 1956, 20 Apr. 1996.

That which is claimed:

1. A Geiger-mode avalanche photodiode comprising:
   an anode contact;
   a cathode contact;
   an output contact electrically insulated from said anode and cathode contacts;
   a semiconductor layer; and
   at least one metal structure in said semiconductor layer and being capacitively coupled to said semiconductor layer and coupled to said output contact;
   said output contact configured to provide for detection of spikes correlated to avalanche events thereon.

2. The Geiger-mode avalanche photodiode of claim 1 wherein said semiconductor layer further comprises a first doped anode region of a first type of conductivity in a substrate.

3. The Geiger-mode avalanche photodiode of claim 2 wherein said at least one metal structure comprises:
   a first metal layer extending from a front surface of said semiconductor layer to reach said first doped anode region for lateral shielding; and
   an insulating layer on said first metal layer.

4. The Geiger-mode avalanche photodiode of claim 3 wherein said semiconductor layer further comprises:
   a cathode region of a second type of conductivity and a respective second cathode metallization layer coupled thereto; and
   a second doped anode region of the first type of conductivity surrounding said cathode region and extending from the front surface of said semiconductor layer to said first doped anode region.

5. The Geiger-mode avalanche photodiode of claim 4 further comprising a third metal layer coupling said first metal layer to said output contact.

6. The Geiger-mode avalanche photodiode of claim 5 further comprising a fourth anode metallization layer defined on the front surface of said semiconductor layer and coupled to said second doped anode region.

7. The Geiger-mode avalanche photodiode of claim 6 wherein said semiconductor layer further comprises:
   a buried doped enrichment region of the first type of conductivity; and
   a doped depletion ring region of the second type of conductivity in said semiconductor layer and surrounding said buried doped enrichment region and extending up to the front surface of the semiconductor layer.

8. The Geiger-mode avalanche photodiode of claim 7 wherein said cathode region includes a plurality thereof and comprising:
   a first doped cathode region extending from the front surface enclosed by said doped depletion ring region to said buried doped enrichment region to couple the doped depletion ring region to the buried doped enrichment region; and
   a second doped cathode region on said buried doped enrichment region, the second cathode metallization layer being defined on said second doped cathode region.

9. The Geiger-mode avalanche photodiode of claim 8 further comprising a conductive layer to define a quenching resistor on said second doped cathode region, said second cathode metallization layer being defined at least in part on said conductive layer.

10. A multi-pixel photo detector array comprising:
    a plurality of Geiger-mode avalanche photodiodes organized in rows and columns, each Geiger-mode avalanche photodiode comprising an anode contact,
a cathode contact,
an output contact electrically insulated from said anode and cathode contacts,
a semiconductor layer, and
at least one metal structure in said semiconductor layer and being capacitively coupled to said semiconductor layer and coupled to said output contact,
said output contact configured to provide for detection of spikes correlated to avalanche events thereon;
a plurality of row pads;
a plurality of metallic buses for coupling photodiodes of a same row to the respective row pad; and
a plurality of column pads;
said metal structures of said plurality of Geiger-mode avalanche photodiodes for Geiger-mode avalanche photodiodes belonging to a same column being electrically coupled to the respective column pad and insulated from metal structures of Geiger-mode avalanche photodiodes of the other columns.

11. The multi-pixel photo detector array of claim 10 wherein said semiconductor layer further comprises a first doped anode region of a first type of conductivity in a substrate.

12. The multi-pixel photo detector array of claim 11 wherein said at least one metal structure comprises:
a first metal layer extending from a front surface of said semiconductor layer to reach said first doped anode region for lateral shielding; and
an insulating layer on said first metal layer.

13. The multi-pixel photo detector array of claim 10 wherein the cathode contacts of Geiger-mode avalanche photodiodes of a row are biased; and wherein time current signals available on said plurality of column pads are read therefrom.

14. The multi-pixel photo detector array of claim 13 wherein the biasing operations of the cathode contacts of all rows of the array are performed simultaneously; and wherein the time current signals available are read one at a time.

15. The multi-pixel photo detector array of claim 10 wherein said plurality of Geiger-mode avalanche photodiodes comprises a monolithic array.

16. A method of making a Geiger-mode avalanche photodiode comprising:
forming an anode contact and a cathode contact;
forming an output contact electrically insulated from the anode and cathode contacts;
forming a semiconductor layer; and
forming at least one metal structure in the semiconductor layer and to be capacitively coupled to the semiconductor layer and to be coupled to the output contact, the output contact providing for detection of spikes correlated to avalanche events thereon.

17. The method of claim 16 further comprising forming the semiconductor layer to comprise a first doped anode region of a first type of conductivity in the semiconductor layer.

18. The method of claim 17 further comprising forming the at least one metal structure to comprise:
a first metal layer extending from a front surface of the semiconductor layer to reach the first doped anode region for lateral shielding; and
an insulating layer on the first metal layer.

19. The method of claim 18 further comprising forming the semiconductor layer to comprise:
a cathode region of a second type of conductivity and a respective second cathode metallization layer coupled thereto; and
a second doped anode region of the first type of conductivity surrounding the cathode region and extending from the front surface of the semiconductor layer to the first doped anode region.

* * * * *